(12) United States Patent
Tsai et al.

(10) Patent No.: US 11,282,726 B2
(45) Date of Patent: Mar. 22, 2022

(54) WAFER CHUCK APPARATUS, METHOD FOR MEASURING WAFER BOW VALUE AND SEMICONDUCTOR PROCESS FLOW

(71) Applicant: Powerchip Semiconductor Manufacturing Corporation, Hsinchu (TW)

(72) Inventors: Cheng-Yen Tsai, Chiayi (TW); Wei-Sheng Chen, New Taipei (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 16/518,998

(22) Filed: Jul. 23, 2019

(65) Prior Publication Data
US 2020/0294828 A1 Sep. 17, 2020

(30) Foreign Application Priority Data
Mar. 12, 2019 (TW) ................. 108108150

(51) Int. Cl.
*H01L 21/66* (2006.01)
*H01L 21/67* (2006.01)
*G01M 3/32* (2006.01)

(52) U.S. Cl.
CPC ...... *H01L 21/67253* (2013.01); *G01M 3/3254* (2013.01); *H01L 21/67288* (2013.01); *H01L 22/12* (2013.01)

(58) Field of Classification Search
CPC .............................................. H01L 21/67253
See application file for complete search history.

(56) References Cited

U.S. PATENT DOCUMENTS

| 5,191,218 A | 3/1993 | Mori et al. |
| 2007/0076345 A1* | 4/2007 | Bang ................. H01L 21/67259 361/234 |
| 2009/0197356 A1 | 8/2009 | Bang et al. |

(Continued)

FOREIGN PATENT DOCUMENTS

| EP | 0840360 | 5/1998 |
| TW | 201444018 | 11/2014 |

(Continued)

OTHER PUBLICATIONS

"Office Action of Taiwan Counterpart Application," dated Aug. 14, 2019, p. 1-p. 6.

*Primary Examiner* — Mohammad M Choudhry
(74) *Attorney, Agent, or Firm* — JCIPRNET

(57) ABSTRACT

A method for measuring wafer bow value comprising the following steps is provided. Place a wafer on a wafer chuck apparatus. A gas inlet process is performed on gas inlet passageways of a passageway pair of the wafer chuck apparatus. A gas outlet process is performed on gas outlet passageways of a passageway pair of the wafer chuck apparatus. A leak rate of each channel pair is measured by the control unit when the wafer is placed on the wafer chuck apparatus and during the gas inlet process and gas outlet process are performed. A wafer bow value of the wafer on the wafer chuck apparatus is estimated by the leak rate of the passageway pair. A wafer chuck apparatus is provided. A semiconductor process flow is provided.

17 Claims, 6 Drawing Sheets

(56) References Cited

U.S. PATENT DOCUMENTS

| | | | | |
|---|---|---|---|---|
| 2015/0200254 A1* | 7/2015 | Diduck | ............... | H01L 24/98 |
| | | | | 428/141 |
| 2015/0219479 A1* | 8/2015 | Adderly | ............ | H01L 21/67288 |
| | | | | 73/861 |
| 2019/0078211 A1* | 3/2019 | Kuenle | ............... | C30B 25/10 |

FOREIGN PATENT DOCUMENTS

| TW | 201636610 | 10/2016 |
|---|---|---|
| TW | 201801130 | 1/2018 |

* cited by examiner

WAFER CHUCK APPARATUS, METHOD FOR MEASURING WAFER BOW VALUE AND SEMICONDUCTOR PROCESS FLOW

CROSS-REFERENCE TO RELATED APPLICATION

This application claims the priority benefit of Taiwan application serial no. 108108150, filed on Mar. 12, 2019. The entirety of the above-mentioned patent application is hereby incorporated by reference herein and made a part of this specification.

BACKGROUND

Technical Field

The disclosure relates to a semiconductor device, a semiconductor measurement method, and a process flow, and more particular, a wafer chuck apparatus, a method for measuring wafer bow value, and a semiconductor process flow.

Description of Related Art

At present, the wafer bow value of the wafer can only be measured by random sampling. Because the wafer bow value of the wafer may cause abnormal film thickness, the yield of the chips is not good. Therefore, how to quickly estimate the wafer bow value of the wafer under the time conditions that affect the output can quickly and effectively improve the process yield.

SUMMARY

The disclosure provides a wafer chuck apparatus adapted to perform a measurement of the wafer bow value on the wafer placed thereon.

The wafer chuck apparatus of the disclosure is adapted to support a wafer. The wafer chuck apparatus includes a base, a plurality of passageway pairs, and a control unit. The base has a holding surface adapted to support the wafer. The passageway pairs are disposed in the base. Each of the plurality of passageway pairs includes a gas inlet passageway and a gas outlet passageway. The control unit includes a plurality of sensors. The sensors are configured corresponding to the gas inlet passageway and the gas outlet passageway of each of the plurality of passageway pairs.

In an embodiment of the disclosure, each passageway pair has only one gas inlet passageway and one gas outlet passageway.

In an embodiment of the disclosure, the outer contour of the base is substantially a circle, and one of the diameters of the circle is a perpendicular bisector of the connecting line segment of the gas inlet passageway and the gas outlet passageway of the corresponding passageway pairs.

In an embodiment of the disclosure, the outer contour of the base is substantially a circle, and the gas inlet passageways and the gas outlet passageways of the plurality of passageway pairs are not disposed on a center of the base.

In an embodiment of the disclosure, the outer contour of the base is substantially a circle, and two of the plurality of passageway pairs are arranged in a point symmetry manner or a line symmetry manner.

Based on the above, the wafer chuck apparatus of the disclosure may be adapted to measure the gas leak rate of the wafer placed thereon.

The disclosure provides a measuring method for converting a gas leak rate to a wafer bow value, which is relatively simpler and faster.

The method for measuring wafer bow value of the disclosure includes the following steps: placing a wafer on the wafer apparatus described above; performing a gas inlet procedure via gas inlet passageways of each of the passageway pairs; performing a gas outlet procedure via gas outlet passageways of each of the passageway pairs; measuring the leak rate of each of the passageway pairs by the control unit in a state where the wafer is placed on the wafer chuck apparatus and the gas inlet procedure and the gas outlet procedure are performed; and estimating the wafer bow value of the wafer on the wafer chuck apparatus by the leak rates of the plurality of passageway pairs.

In an embodiment of the disclosure, the control unit further includes a database. The database stores the corresponding data of the leak rate versus the wafer bow value. The method for measuring wafer bow value of the disclosure further includes the following steps: comparing the data of the leak rate of each of the plurality of passageway pairs with the corresponding data of the leak rate and the wafer bow value in the database to estimate the wafer bow value of the wafer on the wafer chuck apparatus.

In an embodiment of the disclosure, the step of estimating the wafer bow value of the wafer on the wafer chuck apparatus comprises: comparing the data of the leak rate of each of the plurality of passageway pairs with the corresponding data of the leak rate and the wafer bow value in the database according to a quadratic function of the corresponding data of the leak rate versus the wafer bow value in the database.

Based on the above, in the method of measuring wafer bow value of the disclosure, the wafer bow value of the wafer on the wafer chuck apparatus can be estimated by the leak rates of the plurality of passageway pairs in the process. Therefore, the method of measuring wafer bow value of the embodiment may be made simpler and faster.

The disclosure provides a semiconductor process flow that can reduce the risk of defective products or improve yield.

The semiconductor process flow of the disclosure includes the following procedures: performing the aforementioned method for measuring wafer bow value, wherein the database of the control unit further stores a corresponding wafer bow threshold value of a semiconductor process; and performing one of the following procedures according to the corresponding wafer bow threshold value of the semiconductor process and the wafer bow value: performing the semiconductor process, or not performing the semiconductor process.

In an embodiment of the disclosure, the database of the control unit further stores standard recipe of the semiconductor process. The step of performing the semiconductor process include: performing the semiconductor process by adjusting at least part of the process parameters of the semiconductor process according to the wafer bow value and the standard recipe of the semiconductor process.

Based on the above, in the semiconductor process flow of the disclosure, it is possible to determine whether or not the semiconductor process can be performed by the estimated wafer bow value. Therefore, the yield of the semiconductor process flow can be improved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
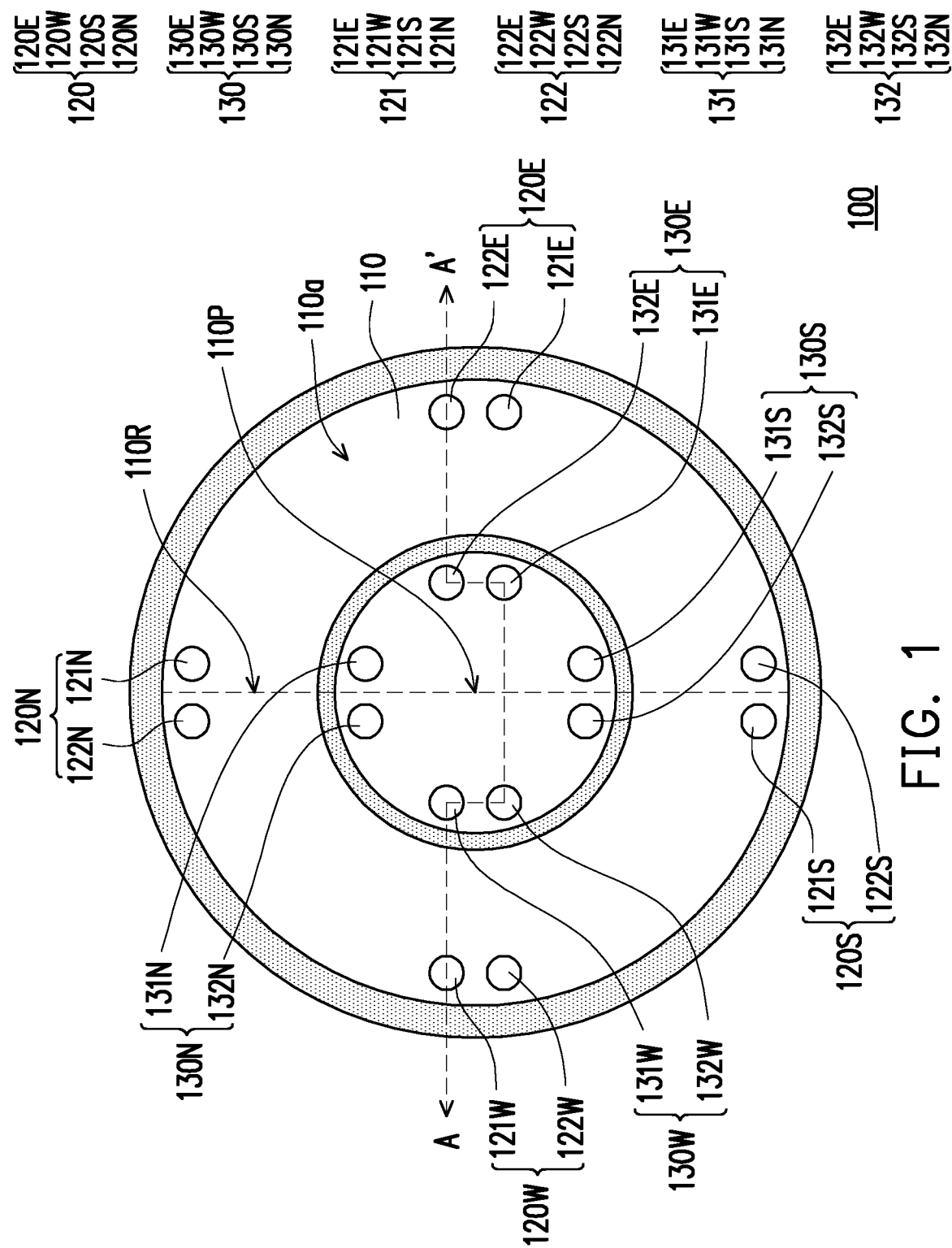
FIG. 1 is a top view of a wafer chuck apparatus according to an embodiment of the disclosure.

The embodiments are described in detail below with reference to the drawings, but the embodiments are not intended to limit the scope of the description. In addition, the drawings are for illustrative purposes only and may be not drawn to the original dimensions. For easier understanding, the same elements in the following description will be denoted by the same reference numerals. In addition, the terms "comprising", "including", "having", "comprise", "include", "have", etc. used in the description are inclusive or open-ended and do not exclude additional, unrecited elements or method steps. In addition, the terms "substantially", "approximately", "about" and the like used in the description may include an acceptable tolerance range. Moreover, the directional terms mentioned in the description, such as "upper" and "lower", are only used to refer to the direction of the figure. Therefore, the directional terminology used is for the purpose of illustration and not limitation.

FIG. 1 is a top view of a wafer chuck apparatus according to an embodiment of the disclosure.

Figure 2:
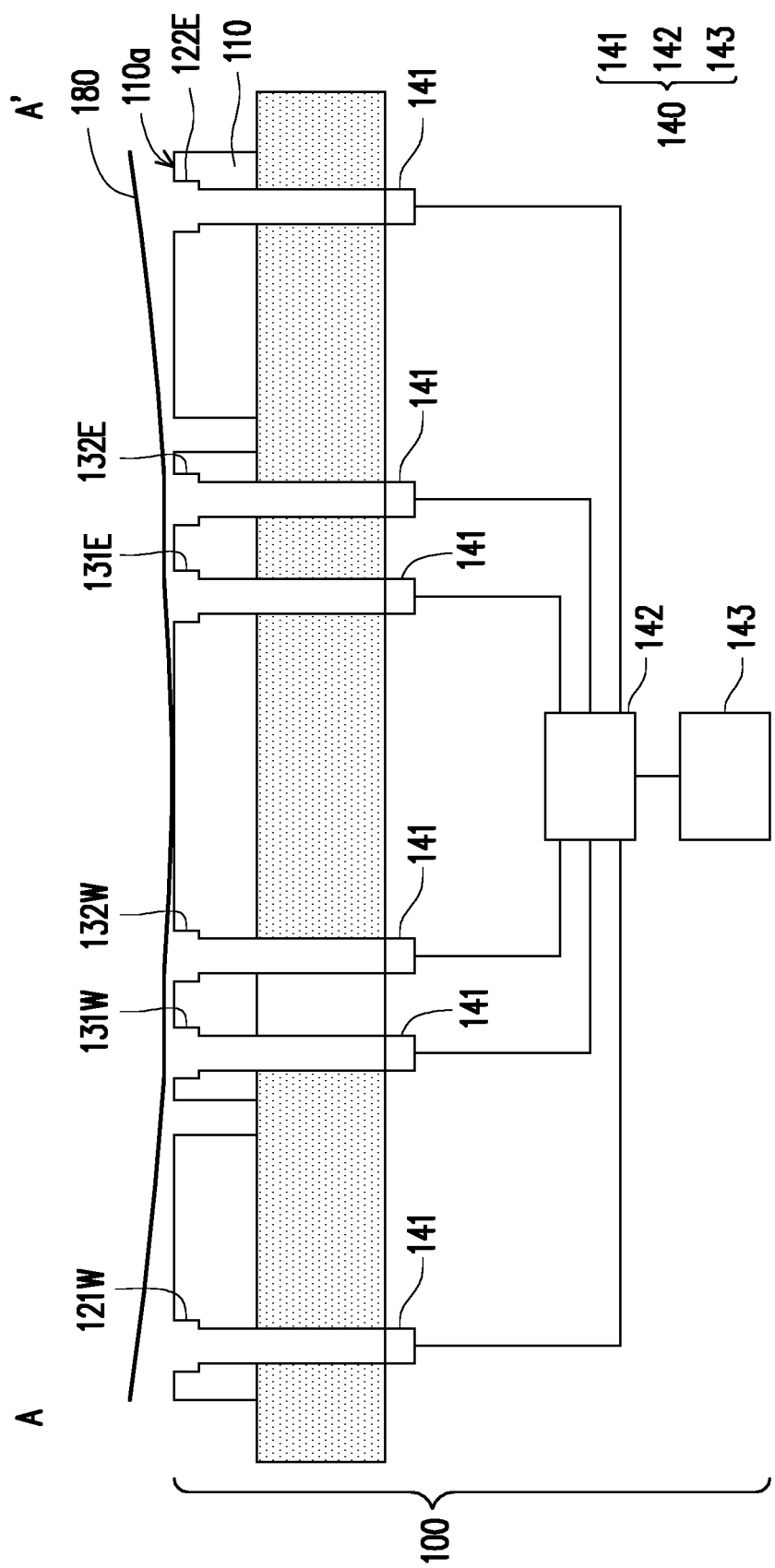
FIG. 2 is a cross-sectional view of a method for measuring a wafer bow value according to an embodiment of the disclosure.

Referring to FIG. 1, a wafer chuck apparatus 100 includes a base 110, a plurality of passageway pairs 120, 130, and a control unit 140 (shown in FIG. 2). The base 110 has a holding surface 110a. Thus, the base 110 is adapted to be used to support a wafer (e.g., wafer 180 depicted in FIG. 2). The passageway pairs 120, 130 are disposed in the base 110. Each passageway pair 120, 130 has a corresponding gas inlet passageway 121, 131 and a gas outlet passageway 122, 132. Control unit 140 includes a plurality of sensors 141 (shown in FIG. 2). The sensor 141 is configured corresponding to the gas inlet passageway 121, 131 and gas outlet passageway 122, 132 of each passageway pair 120, 130.

In the embodiment, each passageway pair may have only one gas inlet passageway and one gas outlet passageway. For example, the passageway pair 120E has a gas inlet passageway 121E and a gas outlet passageway 122E, the passageway pair 120S has a gas inlet passageway 121S and a gas outlet passageway 122S, the passageway pair 120W has a gas inlet passageway 121W and a gas outlet passageway 122W, the passageway pair 120N has a gas inlet passageway 121N and a gas outlet passageway 122N, the passageway pair 130E has a gas inlet passageway 131E and a gas outlet passageway 132E, the passageway pair 130S has a gas inlet passageway 131S and a gas outlet passageway 132S, the passageway pair 130W has a gas inlet passageway 131W and a gas outlet passageway 132W, the passageway pair 130N has a gas inlet passageway 131N and a gas outlet passageway 132N, but the disclosure is not limited thereto.

In the embodiment, the shape of the outer contour of the base 110 may be substantially circular in a top view state, and one of the diameters of the circular base 110 may be the perpendicular bisector of the connecting line segment of the gas inlet passageway and the gas outlet passageway of corresponding passageway pair. For example, one of the diameters 110R of the base 110 may be a perpendicular bisector of the connecting line segment of the gas inlet passageway 121N and the gas outlet passageway 122N of passageway pair 120N, the aforementioned diameter 110R may be a perpendicular bisector of the connecting line segment of the gas inlet passageway 121S and the gas outlet passageway 122S of passageway pair 120S, the aforementioned diameter 110R may be a perpendicular bisector of the connecting line segment of the gas inlet passageway 131N and the gas outlet passageway 132N of passageway pair 130N, and the aforementioned diameter 110R may be a perpendicular bisector of the connecting line segment of the gas inlet passageway 131S and the gas outlet passageway 132S of passageway pair 130S, but the disclosure is not limited thereto.

In the embodiment, the shape of the outer contour of the base 110 may be substantially circular in a top view state, and the gas inlet passageways 121, 131 and the gas outlet passageways 122, 132 of the passageway pairs 120, 130 may not be disposed on the center 110P of the base 110, but the disclosure is not limited thereto.

In the embodiment, the shape of the outer contour of the base 110 may be substantially circular in a top view state, and two of the passageway pairs may be arranged in a point symmetry or line symmetry manner. For example, the passageway pair 120E and the passageway pair 120W may be symmetric with respect to the center 110P of the base 110 (i.e., point symmetry) or the diameter 110R of the base 110 (i.e., line symmetry), the passageway pair 130E and the passageway pair 130W may be symmetric with respect to the center 110P of the base 110 (i.e., point symmetry) or the diameter 110R of the base 110 (i.e., line symmetry), the passageway pair 120N and the passageway pair 120S may be symmetric with respect to the center 110P of the base 110 (i.e., point symmetry) or the diameter (not directly illustrated) of the base 110 (i.e., line symmetry), the passageway pair 130N and the passageway pair 130S may be symmetric with respect to the center 110P of the base 110 (i.e., point symmetry) or the diameter (not directly illustrated) of the base 110 (i.e., line symmetry), but the disclosure is not limited thereto.

In the embodiment, the shape of the peripheral contour of the base 110 may be substantially circular in a top view state, and the distances of at least two of the passageway pairs to the center 110P are different from each other. For example, the distance between the passageway pair 120E and the center 110P is different from the distance between the passageway pair 130E and the center 110P, the distance between the passageway pair 120S and the center 110P is different from the distance between the passageway pair 130S and the center 110P, the distance between the passageway pair 120W and the center 110P is different from the distance between the passageway pair 130W and the center 110P, the distance between the passageway pair 120N and the center 110P is different from the distance between the passageway pair 130N and the center 110P.

Based on the above, the wafer chuck apparatus (e.g., wafer chuck apparatus 100) of the embodiment may be adapted to perform a measurement of the wafer bow value on the wafer (e.g., wafer 180 shown in FIG. 2) placed thereon.

Figure 3:
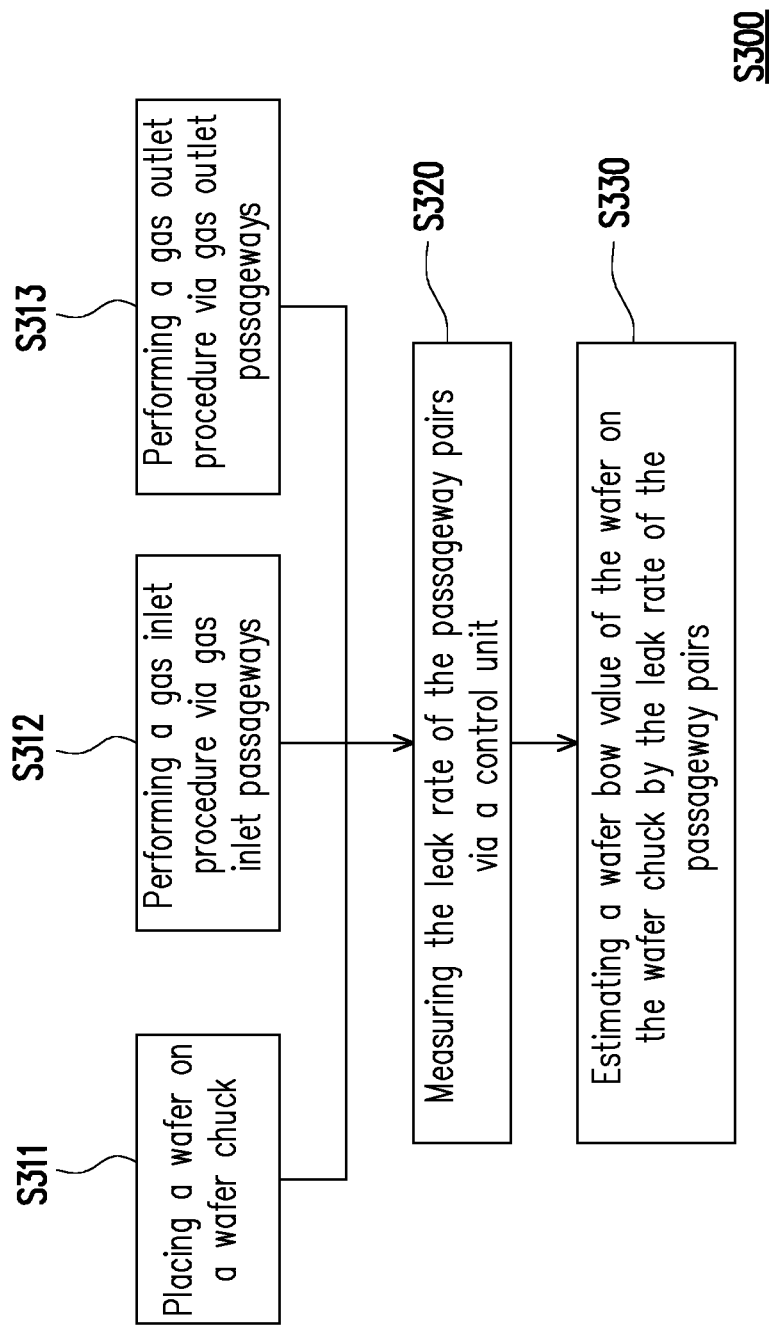
FIG. 3 is a flow chart of a method for measuring a wafer bow value according to an embodiment of the disclosure.
Figure 4:
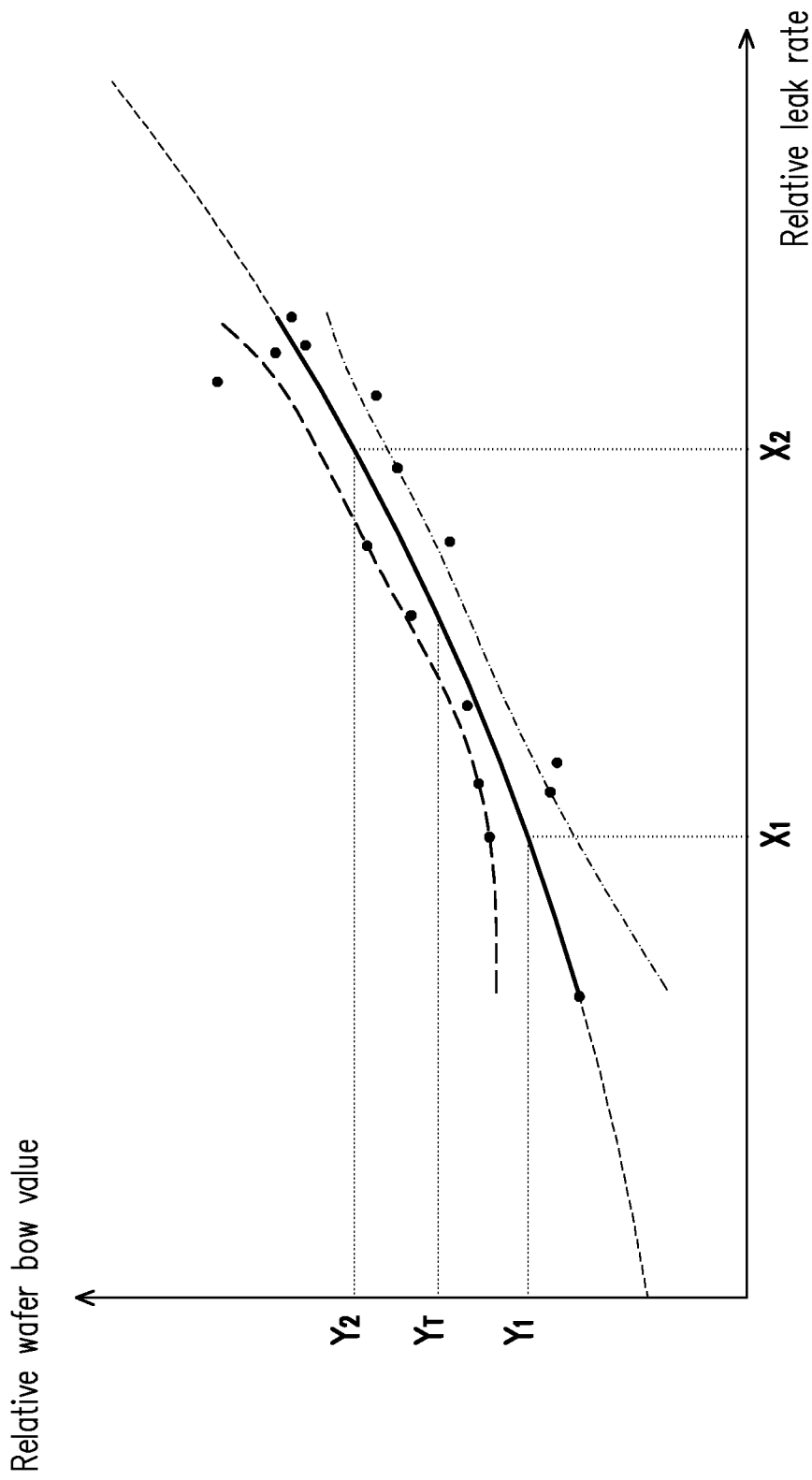
FIG. 4 is a comparing graph of a leak rate of passageway pair versus a wafer bow value according to an embodiment of the disclosure.

FIG. 2 is a cross-sectional view of a method for measuring a wafer bow value according to an embodiment of the disclosure. FIG. 3 is a flow chart of a method for measuring a wafer bow value according to an embodiment of the disclosure. FIG. 4 is a comparing graph of a leak rate of passageway pair versus a wafer bow value according to an embodiment of the disclosure.

Referring to FIG. 2 to FIG. 4, a method S300 for measuring a wafer bow value may include the following steps: step S311: placing a wafer (e.g., wafer 180) on a wafer chuck apparatus (e.g., wafer chuck apparatus 100); step S312: performing a gas inlet procedure via the gas inlet passageway (e.g., the gas inlet passageway 121, 131) of each passageway pair (e.g., the passageway pair 120, 130); step S313: performing a gas outlet procedure via the gas outlet passageway (e.g., the gas outlet passageway 122, 132) of each passageway pair (e.g., the passageway pair 120, 130); step S320: the leak rate of each passageway pair (e.g., passageway pair 120, 130) is measured by the control unit (e.g., control unit 140) in a state where the wafer (e.g., wafer 180) is placed on the wafer chuck apparatus (e.g., wafer chuck apparatus 100) and the gas inlet procedure and the gas outlet procedure are performed; and step S330: estimating a wafer bow value of the wafer (e.g., wafer 180) on the wafer chuck apparatus (e.g., wafer chuck apparatus 100) by the leak rate of each passageway pair (e.g., passageway pair 120, 130).

In the embodiment, the aforementioned gas inlet procedure and/or the gas outlet procedure may be a gas inlet procedure and/or a gas outlet procedure that are commonly used in a general semiconductor manufacturing process, and thus will not be described herein.

In an embodiment, the leak rate of each passageway pair is, for example, a difference between the gas flow rate of the gas inlet passageway and the gas flow rate of the gas outlet passageway in each passageway pair, but the disclosure is not limited thereto. In an embodiment, the leak rate of each passageway pair is, for example, a ratio between the gas flow rate of the gas inlet passageway and the gas flow rate of the gas outlet passageway in each passageway pair, but the disclosure is not limited thereto. In an embodiment, the leak rate of each passageway pair may be a value obtained by further conversion or calculation from the aforementioned difference and/or ratio (e.g., converted to a pressure difference). That is, the sensor 141 of the control unit 140 may be a flow sensor.

In the embodiment, the order of step S311 (placing a wafer on a wafer chuck apparatus), step S312 (performing a gas inlet procedure via the gas inlet passageway of each passageway pair), and step S313 (performing a gas outlet procedure via the gas outlet passageway of each passageway pair) is not limited. In general, step S312 (performing a gas inlet procedure via the gas inlet passageway of each passageway pair) and step S313 (performing a gas outlet procedure via the gas outlet passageway of each passageway pair) may be performed almost simultaneously after step S311 (placing a wafer on a wafer chuck apparatus) is completed, but the present disclosure is not limited thereto.

In the embodiment, the control unit 140 may further include a computing module 142 and a database 143. The computing module 142 may include corresponding hardware and/or software to temporarily store, calculate, and/or generate corresponding output electronic signals according to the electronic signals received by the sensor 141 and/or the data in the database 143. For example, the control unit 140 may be a computer system, but the disclosure is not limited thereto.

In the embodiment, the database 143 can store the corresponding data of the leak rate versus the wafer bow value. For example, if the stored data of leak rate and the corresponding wafer bow value is presented in graphic form, the value of the leak rate versus the corresponding wafer bow value can be shown as FIG. 4. In FIG. 4, the horizontal axis is the relative leak rate, and the vertical axis is the relative wafer bow value.

In the embodiment, the stored data of leak rate and the corresponding wafer bow value in the database 143 can be obtained by means of actual measurement. For example, the actual measured value may be obtained by actually measuring the corresponding shape variable of each point on the wafer 180 by laser and actually measuring the leak rate of each passageway pair 120, 130. In statistics, the actual measured value can have a parametric distribution. In other words, the wafer bow value corresponding to a leak rate value can include an average value and a deviation value acceptable to one having ordinary skill in the art. The aforementioned deviation value may be generated based on a measurement method (e.g., vibration of the wafer 180 at the time of measurement), a measurement-related error, and/or a calculation error propagation. For example, in FIG. 4, the circular point may be the actual measured value, and the solid line may be the polynomial of the obtained leak rate value to the wafer bow value after the regression analysis, the dashed line may be the polynomial regression curve described above plus an upper limit of the deviation value acceptable to one having ordinary skill in the art, and the dotted line may be the aforementioned polynomial regression curve minus the lower limit of the deviation value acceptable to one having ordinary skill in the art. Sometimes, the interval between the dotted line and the dotted line can be referred to as the confidence interval (CI) in statistics.

In FIG. 4, the aforementioned polynomial regression curve (i.e., the solid line in FIG. 4) may be substantially a quadratic function curve. A coefficient of determination ($R^2$) of the actual measured value (i.e., the point of the circle in FIG. 4) versus the aforementioned quadratic function (i.e., a function of the solid line in FIG. 4) is about 0.8512. In other words, the leak rate of each passageway pair (e.g., passageway pair 120, 130) and the wafer bow value of each corresponding position of the wafer (e.g., wafer 180) can be presented by a quadratic function. Therefore, even after step S320 of measuring the leak rate of each passageway pair (e.g., passageway pair 120, 130), the value of the resulting leak rate is not within the range of the actual measured value that has been measured (for example: in the extended range of the solid line segment in FIG. 4), the corresponding wafer bow value may also be estimated by the quadratic function described above in step S330.

Based on the above, in the method of measuring wafer bow value of the embodiment, the wafer bow value of the wafer on the wafer chuck apparatus can be estimated by the leak rates of the plurality of passageway pairs. Moreover, the wafer bow value may be estimated by a database of the control unit. Therefore, the method of measuring wafer bow value of the embodiment may be made simpler and faster. Further, since the data in the database is based on actual measured values. Therefore, the method of measuring wafer bow value of the embodiment can be relatively accurate and can be within a range of deviation values acceptable to one of ordinary skill in the art.

Figure 5:
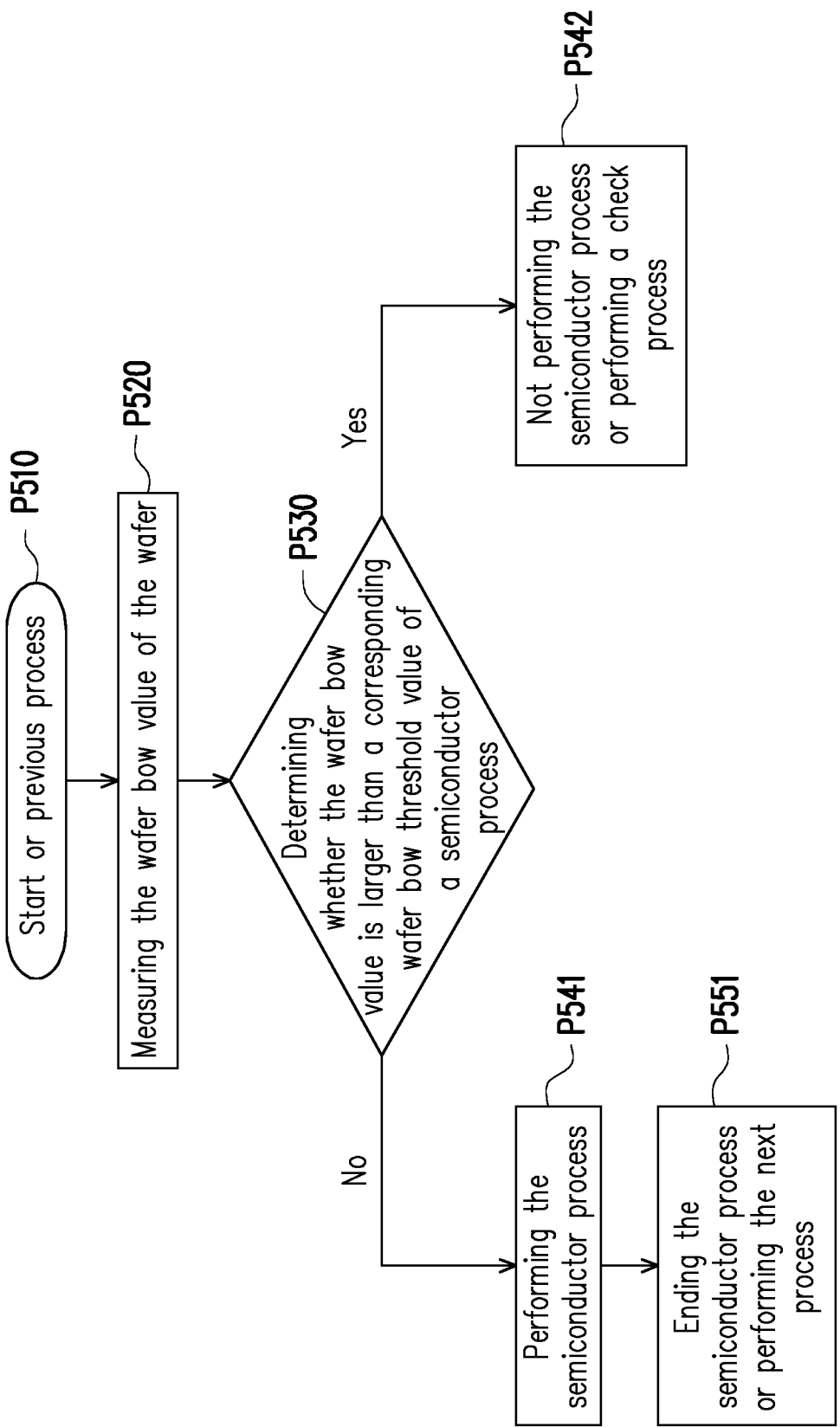
FIG. 5 is a flow chart of a semiconductor process flow according to an embodiment of the disclosure.
Figure 6:
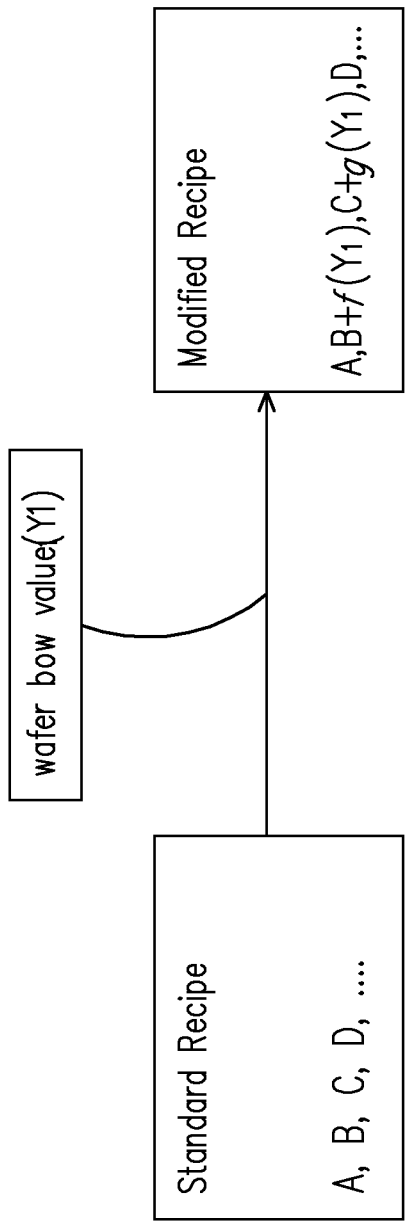
FIG. 6 is a schematic diagram of parameter adjustment of a semiconductor process flow according to an embodiment of the disclosure.

FIG. 5 is a flow chart of a semiconductor process flow according to an embodiment of the disclosure. FIG. 6 is a schematic diagram of parameter adjustment of a semiconductor process flow according to an embodiment of the disclosure.

Referring to FIG. 5, a semiconductor process flow may include the following procedure: procedure P510: start or previous process; procedure P520: measuring the wafer bow value of the wafer (e.g., wafer 180), wherein the procedure P520 may include the aforementioned method S300 for measuring a wafer bow value; procedure P530: determining whether the wafer bow value is larger than a corresponding threshold of bow value of a semiconductor process; if the wafer bow value is less than or equal to the corresponding threshold of bow value of the semiconductor process according to the result of the procedure P530, then performing procedure P541: performing the semiconductor process; after the procedure P541, performing procedure P551: ending the semiconductor process or performing the next process; if the wafer bow value is larger than the corresponding threshold of bow value of the semiconductor process according to the result of the procedure P530, then performing procedure P542: not performing the semiconductor process or performing an inspection process.

Taking the corresponding value in FIG. 4 as an example, it is assumed that an acceptable threshold of wafer bow value is $Y_T$ in a semiconductor process. If the maximum leak rate obtained by measuring each passageway pair (e.g., passageway pair 120, 130) by the control unit (e.g., control unit 140) is $X_1$, then the maximum value of the wafer bow value of the wafer (e.g., wafer 180) on the wafer chuck apparatus can be estimated via the leak rate may be $Y_1$. If the maximum value of the wafer bow value $Y_1$ is less than the threshold of bow value $Y_T$, then the procedure P541, performing the semiconductor process, is performed.

Taking the corresponding value in FIG. 4 as an example, it is assumed that an acceptable threshold of wafer bow value is $Y_T$ in a semiconductor process. If the maximum leak rate obtained by measuring each passageway pair (e.g., passageway pair 120, 130) by the control unit (e.g., control unit 140) is $X_2$, then the maximum value of the wafer bow value of the wafer (e.g., wafer 180) on the wafer chuck apparatus can be estimated via the leak rate may be $Y_2$. If the maximum value of the wafer bow value $Y_2$ is larger than the threshold of bow value $Y_T$, then the procedure P542, not performing the semiconductor process or performing an inspection process, is performed.

In the embodiment, the semiconductor process referred to in the procedure P530, the semiconductor process referred to in the procedure P541, the semiconductor process referred to in the procedure P551, and the semiconductor process referred to in the procedure P542 are the same process, wherein the semiconductor process is, for example, deposition processes, baking processes, grinding processes or other possible semiconductor processes. Before performing the aforementioned semiconductor process and/or performing the aforementioned semiconductor process, the wafer (e.g., wafer 180) may be deformed (e.g., warpage) or the wafer (e.g., wafer 180) may have been deformed. In addition, the aforementioned threshold of bow value (e.g., the threshold of bow value $Y_T$ in FIG. 4) can be adjusted according to the corresponding semiconductor process.

The previous process referred to in the procedure P510 may be any possible process (e.g., wafer transfer) before the foregoing semiconductor process, and thus will not be described herein.

The next process referred to in the procedure P551 may be any possible process (e.g., wafer transfer) after the completion of the aforementioned semiconductor process, and thus will not be described herein.

The inspection process referred to in the program P542 may be a process of detecting the wafer chuck apparatus (e.g., wafer chuck device 100), the wafer (e.g., wafer 180), or other possible devices and/or components, and thus will not be described herein.

In the embodiment, in the procedure P541 for performing the semiconductor process, the semiconductor process can be performed by adjusting at least part of the process parameters of the semiconductor process according to the wafer bow value and the standard recipe of the semiconductor process. The parameter(s) which is/are adjusted may be time, temperature, voltage, current, position, gas flow, liquid flow, and/or other possible parameter(s) in the semiconductor process, and the disclosure is not limited thereto.

In the embodiment, the standard recipe may be stored in the database of the control unit (e.g., the database 143 of the control unit 140), but the disclosure is not limited thereto.

Referring to FIG. 4 to FIG. 6, the standard recipe of the semiconductor process includes at least parameter A, parameter B, parameter C, and parameter D. If the maximum leak rate obtained by measuring each passageway pair (e.g., passageway pair 120, 130) by the control unit (e.g., control unit 140) is $X_1$, then the maximum value of the wafer bow value of the wafer (e.g., wafer 180) on the wafer chuck apparatus (e.g., wafer chuck apparatus 100) can be estimated via the leak rate may be $Y_1$. Moreover, the value $Y_1$ of the wafer bow value may be used as the input value, and the adjustment value $f(Y_1)$ corresponding to the parameter B can be generated by the corresponding function $f$, or the adjustment value $g(Y_1)$ corresponding to the parameter C can be generated by the corresponding function g. In other words, parameter A and parameter D in the standard recipe may not be adjusted, and parameter B and parameter C in the standard recipe may be adjusted. The foregoing function $f$ and the aforementioned function g may be the same or different, and the disclosure is not limited thereto. The foregoing function $f$ and the aforementioned function g may include a linear function, a polynomial function, an exponential function, a logarithm function, a trigonometric function, a step function, and/or a suitable mathematical function, but the disclosure is not limited thereto. In addition, in one embodiment, the corresponding adjustment value generated by the corresponding function may be zero (0) or approach zero (0). That is to say, even if an adjusted value of a process parameter is the same as the value of the standard recipe, if it is the result of inputting the wafer bow value, it can also be included by the above description of "adjusting at least part of the process parameters of the semiconductor process according to the wafer bow value and the standard recipe of the semiconductor process".

Based on the above, in the semiconductor process flow of the embodiment, it is possible to determine whether or not the semiconductor process can be performed by the estimated wafer bow value. Further, if the semiconductor process is to be performed, part of the process parameters can also be adjusted according to the wafer bow value. Therefore, the yield of the semiconductor process flow can be improved.

To sum up, the wafer chuck apparatus of the disclosure may be adapted to perform a measurement of the wafer bow value on the wafer placed thereon. Moreover, in the method of measuring wafer bow value of the disclosure, the wafer bow value of the wafer on the wafer chuck apparatus can be estimated by the leak rates of the plurality of passageway pairs. Therefore, the method of measuring wafer bow value of the embodiment may be made simpler and faster. Further, in the semiconductor process flow of the disclosure, it is possible to determine whether or not the semiconductor process can be performed by the estimated wafer bow value. Therefore, the yield of the semiconductor process flow can be improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A wafer chuck apparatus, adapted to support a wafer and for measuring wafer bow value of the wafer, comprising:
   a base, having a holding surface adapted to support the wafer;
   a plurality of passageway pairs, disposed in the base, wherein each of the plurality of passageway pairs comprises a gas inlet passageway and a gas outlet passageway; and
   a control unit, comprising a plurality of sensors, wherein the plurality of sensors are configured corresponding to the gas inlet passageway and the gas outlet passageway of each of the plurality of passageway pairs, wherein an end of the gas inlet passageway is located on the holding surface, an end of the gas outlet passageway is located on the holding surface, and the wafer is adapted to be disposed on the end of the gas inlet passageway and the end of the gas outlet passageway and in direct physical contact with the holding surface,
   wherein the plurality of sensors are a plurality of flow sensor;
   wherein each of the plurality of passageway pairs comprises only one of the gas inlet passageways and one of the gas outlet passageways; and
   wherein the plurality of sensors are configured corresponding to each of the gas inlet passageway and each of the gas outlet passageway in an one-to-one manner.

2. The wafer chuck apparatus of claim 1, wherein:
   the outer contour of the base is substantially a circle; and
   one of the diameters of the circle is a perpendicular bisector of the connecting line segment of the gas inlet passageway and the gas outlet passageway of the corresponding passageway pairs.

3. The wafer chuck apparatus of claim 1, wherein:
   the outer contour of the base is substantially a circle; and
   the gas inlet passageways and the gas outlet passageways of the plurality of passageway pairs are not disposed on a center of the base.

4. The wafer chuck apparatus of claim 1, wherein:
   the outer contour of the base is substantially a circle; and
   two of the plurality of passageway pairs are arranged in a point symmetry manner or a line symmetry manner.

5. A method for measuring wafer bow value, comprising:
   placing a wafer on a wafer chuck apparatus, wherein the wafer chuck apparatus comprises:
      a base, having a holding surface adapted to support the wafer;
      a plurality of passageway pairs, disposed in the base, wherein each of the plurality of passageway pairs comprises a gas inlet passageway and a gas outlet passageway; and
      a control unit, comprising a plurality of sensors, wherein the plurality of sensors are configured corresponding to the gas inlet passageway and the gas outlet passageway of each of the plurality of passageway pairs, wherein an end of the gas inlet passageway is located on the holding surface, an end of the gas outlet passageway is located on the holding surface, and the wafer is adapted to be disposed on the end of the gas inlet passageway and the end of the gas outlet passageway and in direct physical contact with the holding surface,
      wherein the plurality of sensors are a plurality of flow sensor;
      wherein each of the plurality of passageway pairs comprises only one of the gas inlet passageways and one of the gas outlet passageways; and
      wherein the plurality of sensors are configured corresponding to each of the gas inlet passageway and each of the gas outlet passageway in an one-to-one manner;
   performing a gas inlet procedure via gas inlet passageways of each of the passageway pairs;
   performing a gas outlet procedure via gas outlet passageways of each of the passageway pairs;
   measuring the leak rate of each of the passageway pairs by the control unit in a state where the wafer is placed on the wafer chuck apparatus and the gas inlet procedure and the gas outlet procedure are performed; and
   estimating the wafer bow value of the wafer on the wafer chuck apparatus by the leak rates of the plurality of passageway pairs.

6. The method for measuring wafer bow value of claim 5, wherein the control unit further comprises a database, storing the corresponding data of the leak rate versus the wafer bow value, and the method for measuring wafer bow value further comprises:
   comparing the data of the leak rate of each of the plurality of passageway pairs with the corresponding data of the leak rate and the wafer bow value in the database to estimate the wafer bow value of the wafer on the wafer chuck apparatus.

7. The method for measuring wafer bow value of claim 6, wherein the step of estimating the wafer bow value of the wafer on the wafer chuck apparatus comprising:
   comparing the data of the leak rate of each of the plurality of passageway pairs with the corresponding data of the leak rate and the wafer bow value in the database according to a quadratic function of the corresponding data of the leak rate versus the wafer bow value in the database.

8. The method for measuring wafer bow value of claim 5, wherein:
   the outer contour of the base is substantially a circle; and
   one of the diameters of the circle is a perpendicular bisector of the connecting line segment of the gas inlet passageway and the gas outlet passageway of the corresponding passageway pairs.

9. The method for measuring wafer bow value of claim 5, wherein:
   the outer contour of the base is substantially a circle; and the gas inlet passageways and the gas outlet passageways of the plurality of passageway pairs are not disposed on a center of the base.

10. The method for measuring wafer bow value of claim 5, wherein:
the outer contour of the base is substantially a circle; and
two of the plurality of passageway pairs are arranged in a point symmetry manner or a line symmetry manner.

11. A semiconductor process flow, comprising:
performing a method for measuring wafer bow value, comprising:
placing a wafer on a wafer chuck apparatus, wherein the wafer chuck apparatus comprises:
a base, having a holding surface adapted to support the wafer;
a plurality of passageway pairs, disposed in the base, wherein each of the plurality of passageway pairs comprises a gas inlet passageway and a gas outlet passageway; and
a control unit, comprising:
a plurality of sensors, wherein the plurality of sensors are configured corresponding to the gas inlet passageway and the gas outlet passageway of each of the plurality of passageway pairs, wherein an end of the gas inlet passageway is located on the holding surface, an end of the gas outlet passageway is located on the holding surface, and the wafer is adapted to be disposed on the end of the gas inlet passageway and the end of the gas outlet passageway and in direct physical contact with the holding surface,
wherein the plurality of sensors are a plurality of flow sensor;
wherein each of the plurality of passageway pairs comprises only one of the gas inlet passageways and one of the gas outlet passageways; and
wherein the plurality of sensors are configured corresponding to each of the gas inlet passageway and each of the gas outlet passageway in an one-to-one manner; and
a database, storing a corresponding wafer bow threshold value of a semiconductor process;
performing a gas inlet procedure via gas inlet passageways of each of the passageway pairs;
performing a gas outlet procedure via gas outlet passageways of each of the passageway pairs;
measuring the leak rate of each of the passageway pairs by the control unit in a state where the wafer is placed on the wafer chuck apparatus and the gas inlet procedure and the gas outlet procedure are performed; and
estimating the wafer bow value of the wafer on the wafer chuck apparatus by the leak rates of the plurality of passageway pairs; and
performing one of the following procedures according to the corresponding wafer bow threshold value of the semiconductor process and the wafer bow value:
performing the semiconductor process; or
not performing the semiconductor process.

12. The semiconductor process flow of claim 11, wherein the database of the control unit further stores standard recipe of the semiconductor process, and the step of performing the semiconductor process comprising:
performing the semiconductor process by adjusting at least part of the process parameters of the semiconductor process according to the wafer bow value and the standard recipe of the semiconductor process.

13. The semiconductor process flow of claim 11, wherein the database of the control unit further stores the corresponding data of the leak rate versus the wafer bow value, and the method for measuring wafer bow value further comprises:
comparing the data of the leak rate of each of the plurality of passageway pairs with the corresponding data of the leak rate and the wafer bow value in the database to estimate the wafer bow value of the wafer on the wafer chuck apparatus.

14. The semiconductor process flow of claim 13, wherein the step of estimating the wafer bow value of the wafer on the wafer chuck apparatus comprising:
comparing the data of the leak rate of each of the plurality of passageway pairs with the corresponding data of the leak rate and the wafer bow value in the database according to a quadratic function of the corresponding data of the leak rate versus the wafer bow value in the database.

15. The semiconductor process flow of claim 11, wherein:
the outer contour of the base is substantially a circle; and
one of the diameters of the circle is a perpendicular bisector of the connecting line segment of the gas inlet passageway and the gas outlet passageway of the corresponding passageway pairs.

16. The semiconductor process flow of claim 11, wherein:
the outer contour of the base is substantially a circle; and
the gas inlet passageways and the gas outlet passageways of the plurality of passageway pairs are not disposed on a center of the base.

17. The semiconductor process flow of claim 11, wherein:
the outer contour of the base is substantially a circle; and
two of the plurality of passageway pairs are arranged in a point symmetry manner or a line symmetry manner.

* * * * *